(12) United States Patent
Robinson

(10) Patent No.: US 8,110,903 B2
(45) Date of Patent: Feb. 7, 2012

(54) QFN PACKAGE

(75) Inventor: Peter John Robinson, Cambridgeshire (GB)

(73) Assignee: Cambridge Silicon Radio Ltd. (GB)

( * ) Notice: Subject to any disclaimer, the term of this patent is extended or adjusted under 35 U.S.C. 154(b) by 120 days.

(21) Appl. No.: 12/544,468

(22) Filed: Aug. 20, 2009

(65) Prior Publication Data
US 2010/0052141 A1 Mar. 4, 2010

(30) Foreign Application Priority Data
Sep. 1, 2008 (GB) .................................. 0815870.1

(51) Int. Cl.
*H01L 23/495* (2006.01)

(52) U.S. Cl. ................ 257/666; 257/690; 257/E21.499; 438/124

(58) Field of Classification Search .................. 257/666, 257/676, 690, E21.499, E21.502, E23.031, 257/787, E23.116; 438/123, 124
See application file for complete search history.

(56) References Cited

U.S. PATENT DOCUMENTS

| | | | | |
|---|---|---|---|---|
| 6,025,640 | A * | 2/2000 | Yagi et al. | 257/666 |
| 6,437,429 | B1 * | 8/2002 | Su et al. | 257/666 |
| 7,015,591 | B2 | 3/2006 | Lee | |
| 7,045,882 | B2 * | 5/2006 | Paek | 257/666 |
| 7,217,991 | B1 * | 5/2007 | Davis | 257/676 |

* cited by examiner

*Primary Examiner* — Roy Potter
(74) *Attorney, Agent, or Firm* — Greenberg Traurig, LLP

(57) ABSTRACT

An improved Quad Flat No-Lead package is described. The package is formed by encapsulating a die mounted on a leadframe with a moulding compound using a mould chase. The mould chase comprises a number of internal projections which form openings in the mould compound to expose regions of the leadframe. These exposed regions of the leadframe may then be used for soldering the package to a substrate. The arrangement of the openings may be designed such that each aperture is the same shape and size and/or that the apertures are arranged in multiple rows on the underside of the package.

16 Claims, 13 Drawing Sheets

QFN PACKAGE

BACKGROUND

Quad Flat No-Lead (QFN) packaging technology can be used to produce packaged die which are not significantly bigger than the actual die. QFN packages are fabricated by attaching the die to a metal leadframe and forming electrical connections between the leadframe and pads on the die using wirebonds. A moulding compound (which may also be referred to as a 'mould', 'mold' or 'molding' compound) is then used to encapsulate the die and the wirebonds and form the package. One face of the leadframe is exposed on the base of the QFN package and the exposed areas of metal may be used to attach the QFN package to a printed circuit board (PCB) or other substrate, e.g. using solder paste which may be stencil printed onto the PCB.

Chip-on-Lead (CoL) is a variant of QFN in which the die is mounted directly onto all or some of the leads (which may also be referred to as 'terminals' or 'electrical terminals'), often in addition to mounting onto a separate die attach region of the leadframe, which may be referred to as the paddle. Use of CoL QFNs may enable smaller packages, because there is a reduction in the minimum distance between the edge of the die and the package edge (e.g. a reduction from around 1 mm to around 0.5 mm). FIG. 1 shows a comparison of a QFN package 101 and a CoL QFN package 102. Each example shows a cross-section through a portion of a package and shows the leadframe 111, 112, die 121, 122, adhesive 131, 132, wirebonds 141, 142 and moulding compound 151, 152.

As the areas of metallization on the underside of the package are of different sizes, problems may arise when soldering the QFN packages onto a substrate. In particular, during solder attachment where a large region of solder under the paddle, can cause the package to float up during the solder-reflow process, without a solder joint being formed to some of the smaller leads around the periphery of the device. The embodiments described below are not limited to implementations which solve any or all of the disadvantages of known QFN packages and methods of manufacturing QFN packages.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved Quad Flat No-Lead package is described. The package is formed by encapsulating a die mounted on a leadframe with a moulding compound using a mould chase. The mould chase comprises a number of internal projections which form openings in the mould compound to expose regions of the leadframe. These exposed regions of the leadframe may then be used for soldering the package to a substrate. The arrangement of the openings may be designed such that each aperture is the same shape and size and/or that the apertures are arranged in multiple rows on the underside of the package.

A first aspect provides a packaged die comprising a leadframe and a die attached to the leadframe, wherein the die and the leadframe are encapsulated in a moulding compound and the packaged die further comprising a plurality of apertures in the moulding compound each of which expose a portion of the leadframe.

Each aperture may be formed by an internal projection in a mould chase used when encapsulating the die and the leadframe.

Each aperture may form an area for connection of the packaged die to a substrate. The area may be used for at least one of a physical connection, an electrical connection and a thermal connection.

Each of the plurality of apertures may have the same area.

The leadframe may have a substantially constant thickness.

The plurality of apertures may be formed on an underside of the packaged die and are arranged in at least two rows of apertures around a portion of the periphery of the underside.

The leadframe may comprise a lead that fans underneath the die and wherein one of the plurality of apertures exposes a portion of the lead underneath the die.

The packaged die may further comprise a plurality of solder elements, wherein each solder elements is attached to an exposed portion of the leadframe.

The package die may be a Quad Flat No-Lead package or a Chip-on-Lead Quad Flat No-Lead package.

A second aspect provides a method of fabricating a packaged die comprising: attaching a die to a leadframe; wirebonding the die to the leadframe; and encapsulating the die and the leadframe using a mould compound and a mould chase comprising a plurality of projections, wherein each projection forms an aperture in the mould compound that exposes a portion of the leadframe.

The method may further comprise: separating the encapsulated die to form a plurality of packaged die.

The method may further comprise: attaching a solder element to each exposed portion of the leadframe.

Each of the plurality of apertures may have the same area.

The leadframe may have a substantially constant thickness.

The package die may be a Quad Flat No-Lead package or a Chip-on-Lead Quad Flat No-Lead package.

Further aspects provide a packaged IC substantially as described with reference to any of FIGS. 2-6 and 8-13 of the drawings and a method of packaging an IC substantially as described with reference to FIG. 7 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
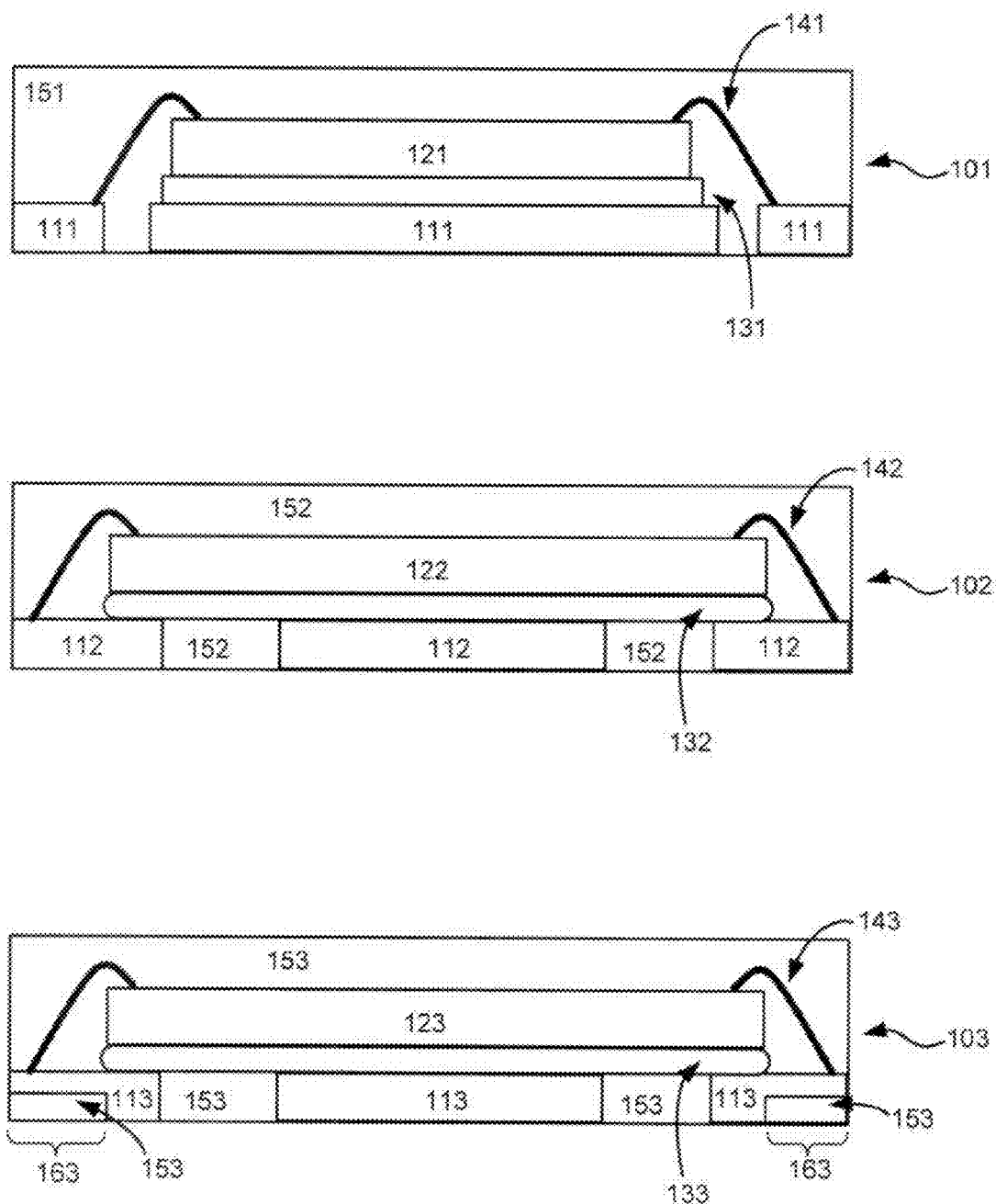
FIG. 1 shows a comparison of a QFN package and a CoL QFN package and an example of a package comprising a part-etched leadframe.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

As described above, FIG. 1 shows a comparison of a QFN package 101 and a CoL QFN package 102. Use of CoL QFNs may enable smaller packages and can also provide an increase in the number of leads for a given package size, by enabling an area array of leads—some, or all, of which may be located underneath the die. This is typically achieved using half- or part-etched leadframes, where the full thickness areas of leadframe form the exposed leads. This is shown in the third example, 103, in FIG. 1, which shows a cross-section through a portion of a package including the leadframe 113, die 123, adhesive 133, wirebonds 143 and moulding compound 153. The half- or part-etched regions of the leadframe 113 are indicated by brackets 163.

Figure 2:
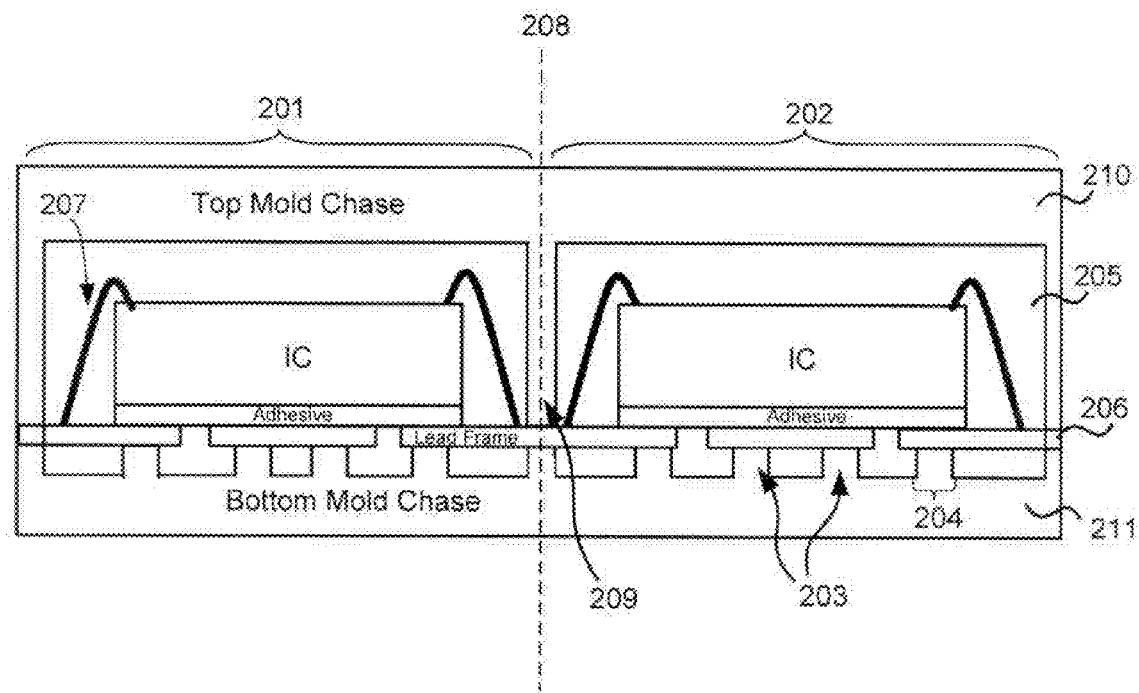
FIG. 2 shows a schematic diagram of two improved CoL QFN packages.

FIG. 2 shows a schematic diagram of two improved CoL QFN packages 201, 202. The packages are formed using a mould (which may also be referred as a mold, mould chase or mold chase) which has internal projections 203 which create apertures 204 in the moulding compound 205 to expose the leadframe 206.

Figure 3:
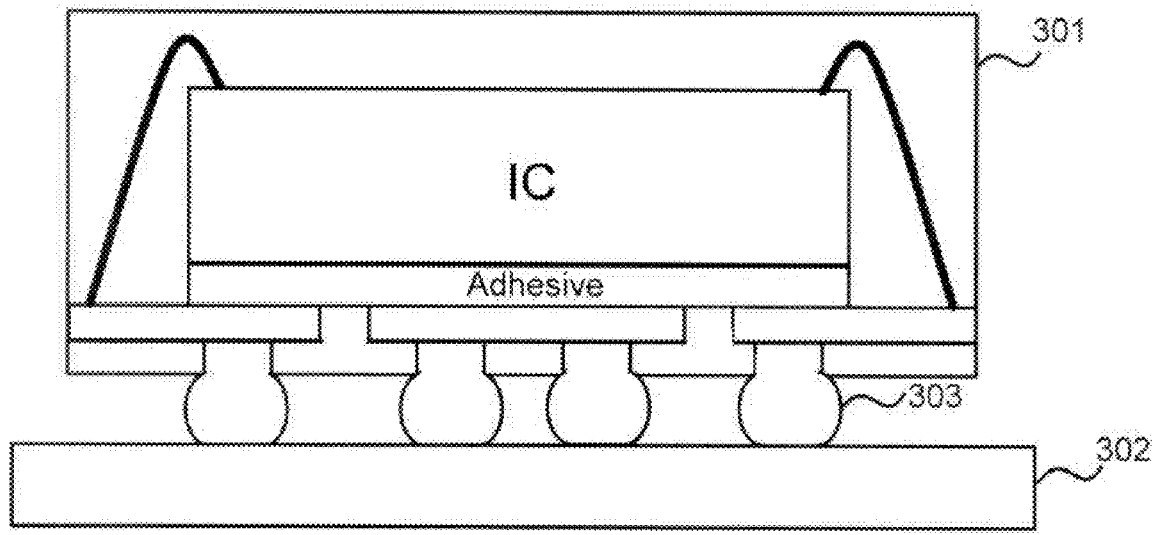
FIG. 3 shows a schematic diagram of an improved CoL QFN package bonded to a substrate.

The apertures 204 in the moulding compound 205 form solder lands (i.e. areas to which solder can wet), which can be used in bonding the package to a substrate, as shown in FIG. 3, or to provide lands for package attachment using an alternative material (e.g. for adhesive attachment) or to provide any form of electrical terminal (e.g. for pressure contacts, mounting in a socket etc.). FIG. 3 shows a schematic diagram of an improved CoL QFN package 301 bonded to a substrate 302 using a number of solder balls 303. It will be appreciated that other forms of solder elements may alternatively be used, e.g. solder bumps. References to solder balls in the following description are by way of example only.

Figure 4:
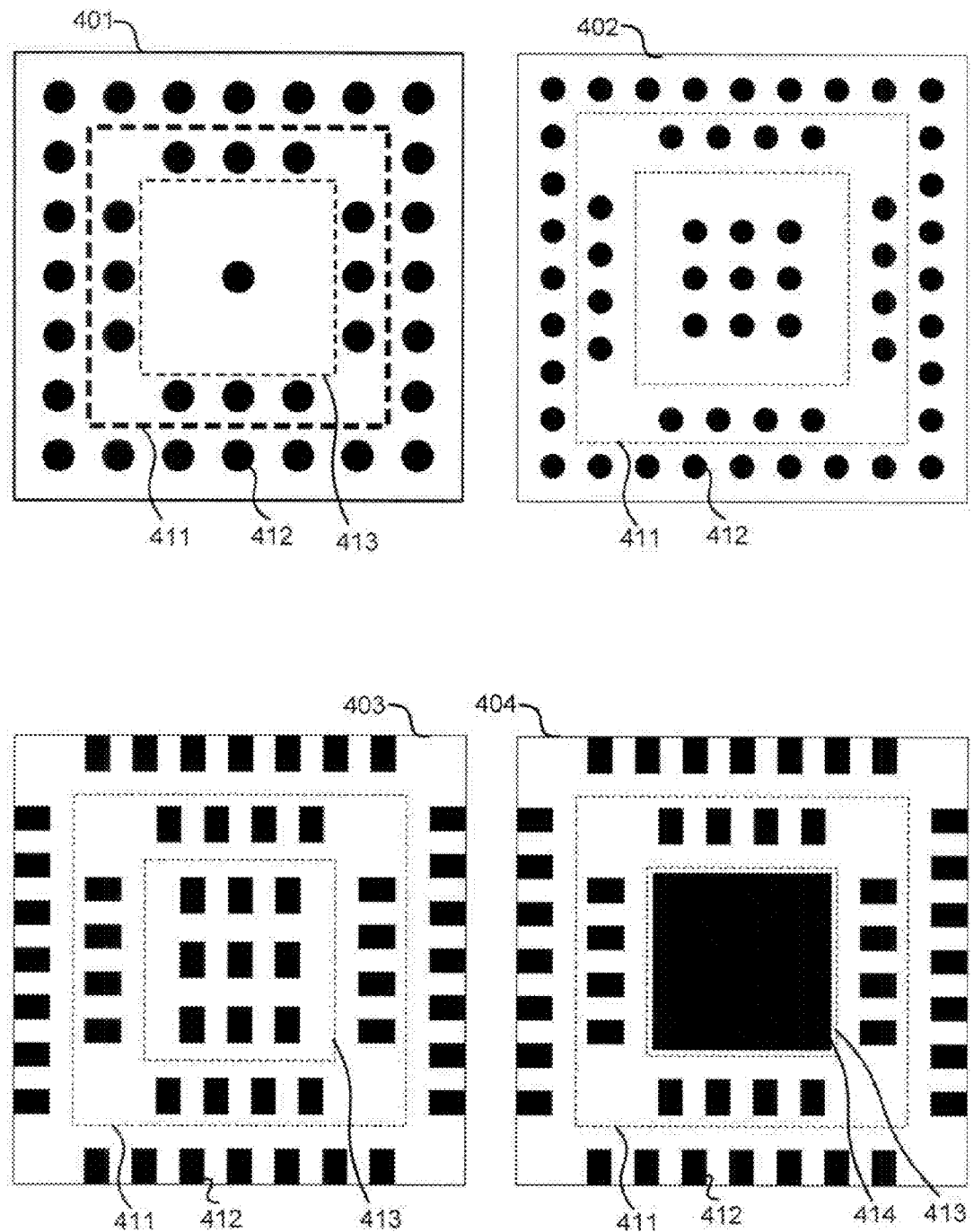
FIG. 4 shows schematic diagrams of bottom views of four example improved CoL QFN packages.

The apertures 204 in the moulding compound 205 may be of any size or shape and may be in any arrangement and their size, shape and arrangement are defined by the projections 203 in the mould chase. FIG. 4 shows schematic diagrams of a bottom views of four examples of improved CoL QFN packages 401-404 which each show a number of exposed lands 412 which are all the same size and shape. The examples in FIG. 4 also show the outline of the die (or integrated circuit (IC)) 411 and the lands may be outside and/or within the outline of the die. In the second and third examples, 402-403, the outline of the paddle is shown 413 and some of the exposed lands 412 are underneath the paddle whilst others are outside the paddle area and may be used to provide electrical connections to leads which fan underneath the die (as described in more detail below). The fourth example 404 has an exposed paddle 414.

If all the apertures are the same size and configuration, the corresponding solder bumps formed on a substrate to which the package is to be bonded (e.g. substrate 302 in FIG. 3) can all be the same shape and size. This means that when the solder is reflowed, all the resulting solder bumps should be the same height and this increases the yield and reliability of the solder bonding process. Additionally, the geometry of the apertures may be chosen such that solder balls (solder bumps or other solder elements), could be applied to the QFN package and used to mount the package on a substrate in a similar manner to a BGA (ball grid array) package.

As shown in FIG. 2, the leads (within the leadframe 206) can fan underneath the die, such that the aperture 204 on the lead is underneath the die, rather than around the periphery of the die (e.g. underneath where a wirebond 207 joins the leadframe 206). Routing of leads underneath the die can be used to make better use of the available area on the bottom of the package and/or to create multiple rows of lands. This is shown in FIG. 5.

Figure 5:
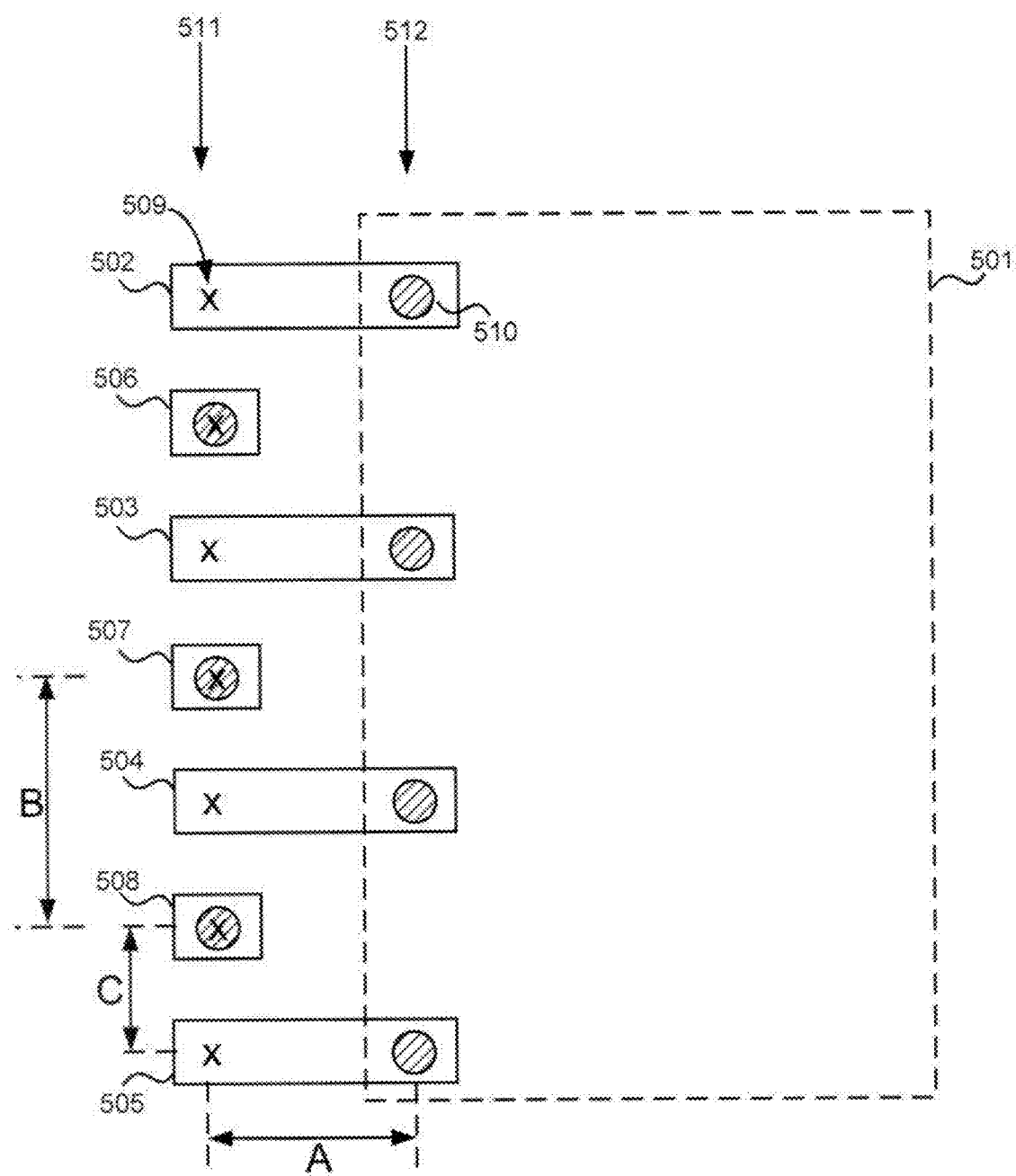
FIG. 5 shows a schematic diagram of a QFN package in which leads fan underneath the die.

FIG. 5 shows a schematic diagram of a die (indicated by the dotted outline 501) and a number of leads 502-508, some of which (502-505) fan underneath the die. In FIG. 5, the positions of the wirebonds on the leads are marked with an 'X' 509 and the positions of the apertures in the moulding compound which form the solder lands are shown as shaded circles 510. In the example of FIG. 5, those leads 502-505 which fan underneath the die have solder lands towards their interior (or inboard) end (i.e. underneath the die and at the opposite end of the lead to the wirebond position) and those leads 506-508 which do not fan underneath the die have solder lands towards the peripheral ends of the leads (i.e. at the same end of the lead as the wirebond position). Such an arrangement enables the formation of multiple rows of solder lands (indicated by arrows 511, 512). Furthermore, such an arrangement enables the spacing of the leads to be reduced and not limited by any design rules relating to the spacing of solder lands. This is because alternate leads fan underneath the die and therefore alternate solder lands are in different rows 511, 512. As shown in FIG. 5, the spacing of the solder lands is labelled A and B (for each of the two perpendicular directions) and each of these spacings is larger than the spacing of the leads, as labelled C in FIG. 5. The spacing of the lands (A, B) may be restricted by design rules relating to solder bonding, whilst the spacing of the leads (C) may instead be dominated by design rules for wirebonding, leadframe manufacture or by the IC design (e.g. the position and number of I/Os).

Use of the methods described herein to create multiple rows of solder lands and/or to fan leads to solder lands underneath the die is an improvement over known techniques, which involve etching the leadframe and/or part-sawing the leadframe. Using the techniques described herein, the leadframe need not be part-etched (or part-sawn), e.g. as shown in example 103 in FIG. 1. As a result the manufacturing process is simplified and the overall leadframe thickness may be reduced (which may enable a reduced lead pitch) or may stay the same (e.g. 150 µm thick), which provides a more robust leadframe (and may improve the yield of the wirebonding process). The methods described herein may be used to make low cost packaged ICs, where the ICs have too many connections for single row QFNs.

The two improved CoL QFN packages shown in FIG. 2 are designed to be punched out to separate the packages (e.g. along doffed line 208). Internal projections 209 in the upper mould chase 210 and corresponding internal projections in the lower mould chase 211 expose a portion of the leadframe on both sides along the punch line 208. These internal projections 209 in the upper mould chase 210 also serve to clamp the leadframe 206 against the lower mould chase 211 which may assist in forming the apertures 203. Alternatively, or additionally, other techniques may be used to ensure that the leadframe 206 is held in contact with the lower mould chase 211 (e.g. film assisted moulding).

Figure 6:
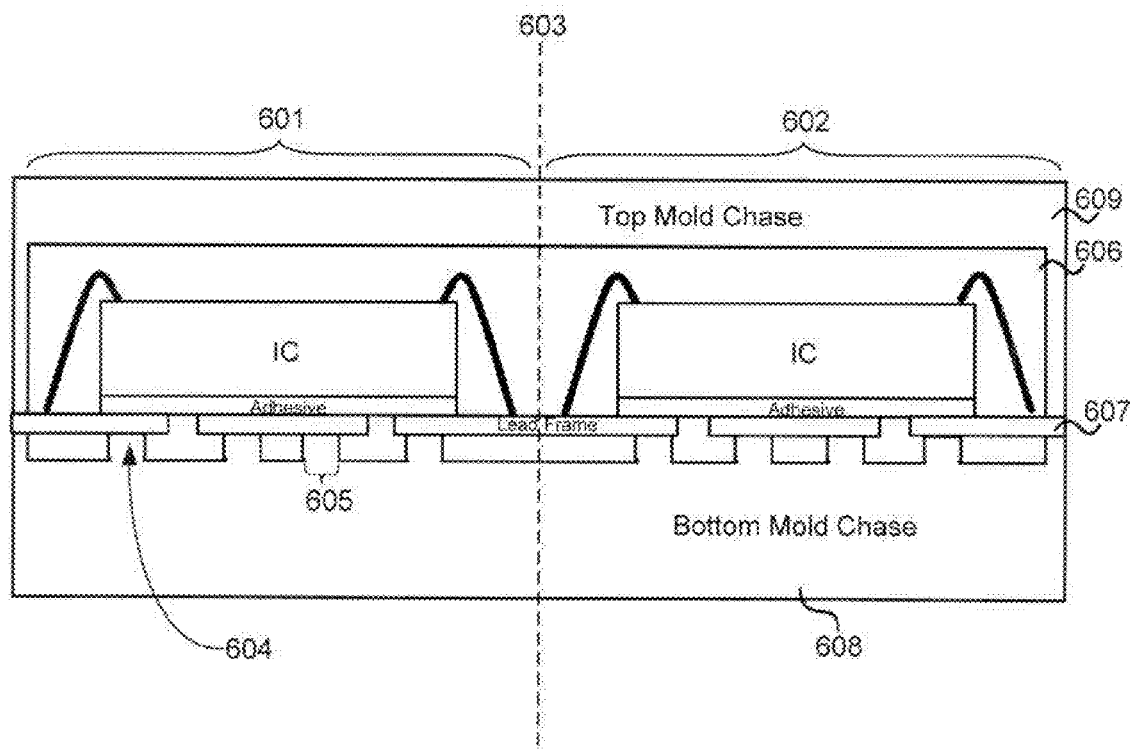
FIG. 6 shows a schematic diagram of another two improved CoL QFN packages.

FIG. 6 shows a schematic diagram of two improved CoL QFN packages 601, 602 which are designed to be sawn (e.g. along dotted line 603) rather than punched. As in FIG. 2, the packages are formed using a mould chase which has internal projections 604 which create apertures 605 in the moulding compound 606 to expose the leadframe 607. In a sawn example, as shown in FIG. 6, only one of the mould chases (e.g. the bottom mould chase 608) may comprise internal projections 604 or both mould chases 608, 609 may comprise projections.

Figure 7:
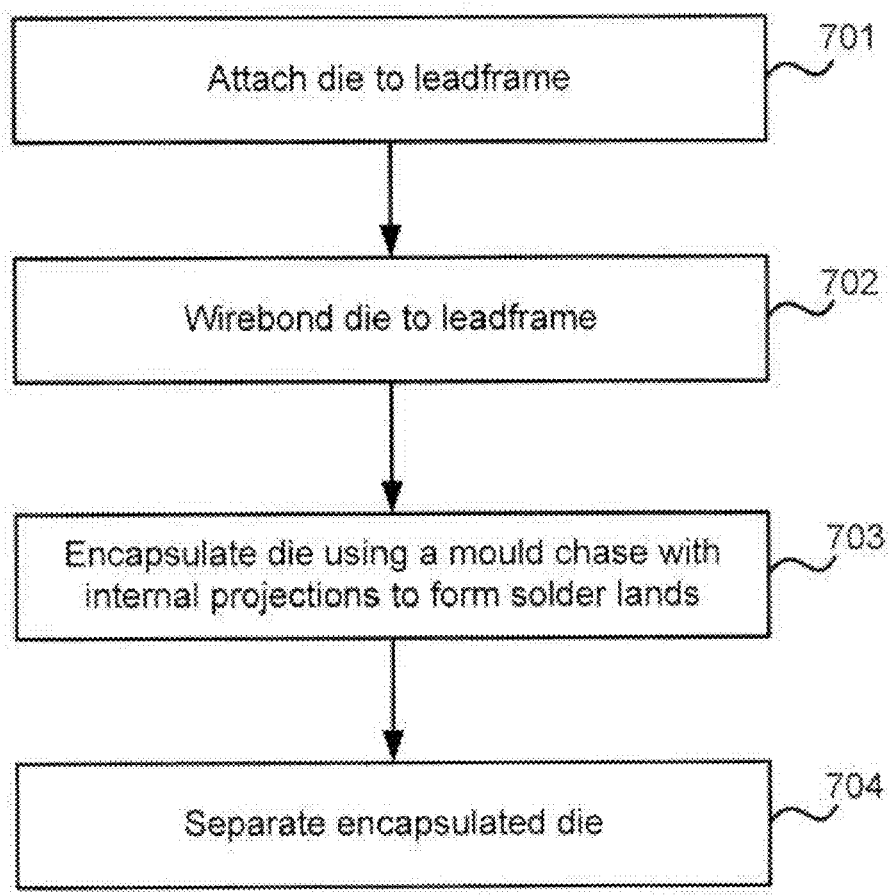
FIG. 7 shows a flow diagram of an example method of manufacture of an improved QFN package.

FIG. 7 shows a flow diagram of an example method of manufacture of an improved QFN package, such as an improved CoL QFN package as described above. The die are attached to the leadframe (block 701) using any suitable material, such as a film adhesive, which typically is electrically non-conductive, and then the die is wirebonded to the leadframe (block 702). These wirebonds form the electrical connection between pads on the die and the leads in the leadframe. This process is typically performed on a leadframe strip or sheet which supports many die (e.g. many hundreds of die) and provides economies of scale in processing. Once all the die have been attached (in block 701) and wirebonded (in block 702), the leadframe and die are encapsulated in a moulding compound using a mould chase with internal projections to form solder lands (block 703) and then the encapsulated die are separated (block 704), for example by punching or sawing (or any other process, e.g. laser ablation, metal etching etc.).

The moulding process (in block 703) may use any suitable moulding technique which uses a mould chase. In an example, film assisted moulding may be used (e.g. as developed by Boschman Technologies. b.v.). The film provides protection for the die and forms a gasket between the mould chase and the lead frame to prevent bleeding of the moulding compound. Moulding techniques which are used for the manufacture of exposed-die packages may also be used.

FIG. 7 does not show the addition of solder elements (e.g. solder balls, or plated or stencil printed solder); however solder elements may be added prior to separation of the encapsulated die (i.e. prior to block 704) or at an alternative stage in the process (e.g. after block 704).

Figure 8:
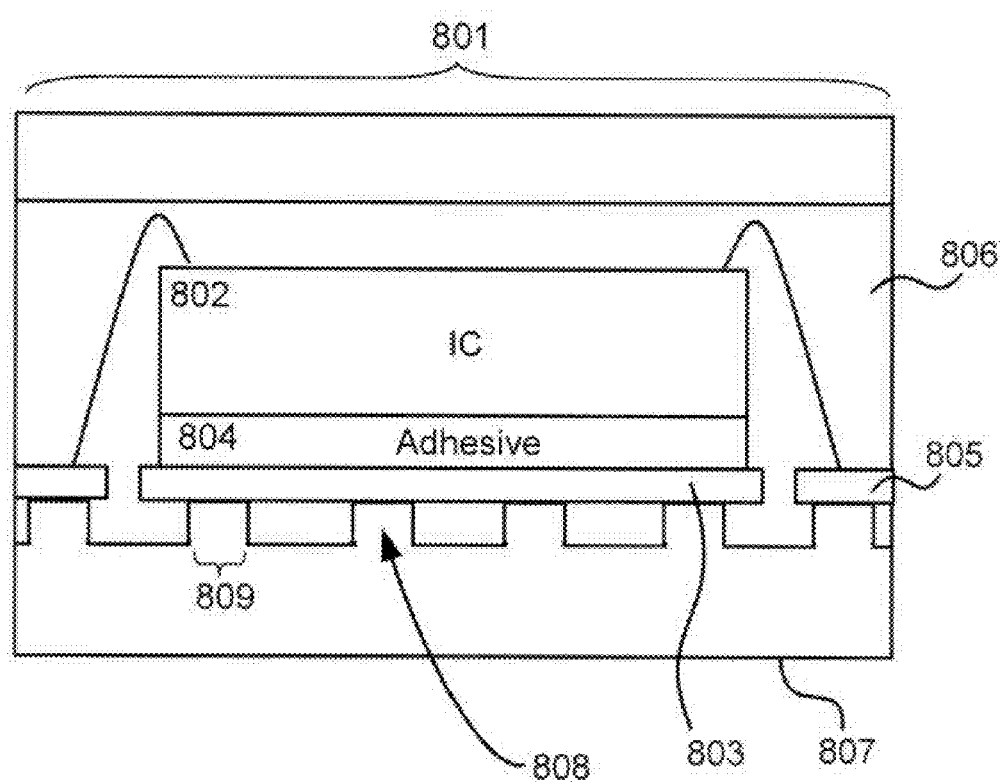
FIGS. 8-12 show further examples of improved QFN packages.

Although all the examples described above are CoL QFN packages, the techniques may also be applied to other QFN packages which are not chip-on-lead. FIG. 8 is a schematic diagram of an improved QFN package 801. In this example, the die 802 is mounted on a paddle 803 which extends beyond the die. The die may be mounted using an adhesive 804 or other material which may be electrically conductive or non-conductive. As described above, the die 802 and leadframe 805 are encapsulated (after wirebonding) in a moulding compound 806 using a mould chase 807 which has internal projections 808 which create apertures 809 in the moulding compound 806 to expose the leadframe 805. This improved QFN package 801 may, for example, be a sawn or a punched QFN package.

The example in FIG. 8 shows a number of apertures forming solder lands underneath the paddle 803. It will be appreciated that the number, shape and configuration of the solder lands may be chosen by the designer and implemented through the design of the internal projections in the mould chase.

Figure 9:
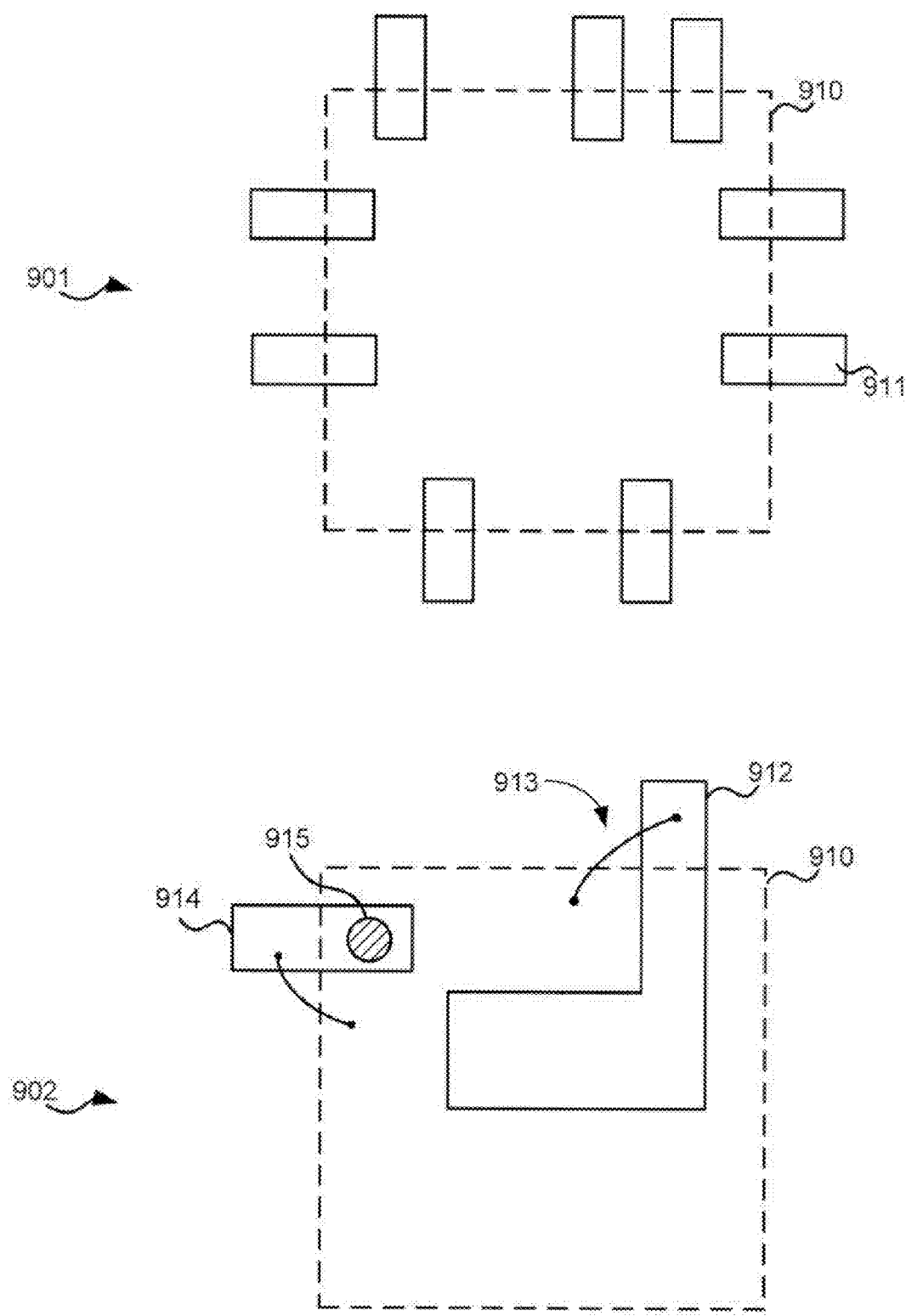

The methods described above enable a very flexible design of a QFN package and of the leadframe and arrangement of solder lands. There are many different ways in which the leadframe can route between wirebond connections to the die and solder lands which enable connections to the substrate. In the examples of FIGS. 2 and 6, the die is mounted on a region of leadframe which is smaller than the die and in the example of FIG. 8, the die is mounted on a region of leadframe (the paddle 803) which is larger than the die. FIG. 9 shows schematic diagrams of further examples. In a first example 901, there may be no leadframe underneath the majority of the die (indicated by outline 910) but instead the die may be mounted onto the ends of a plurality of leads 911. In a second example 902, a portion of the paddle 912 may extend beyond the die, e.g. to enable the paddle and a ground connection on the die to be connected to ground on the substrate (through the solder lands under the paddle and a wirebond 913). Additionally, in the second example, a lead 914 may fan underneath the die to provide flexibility in the position of solder lands (as indicated by shaded area 915).

Figure 10:
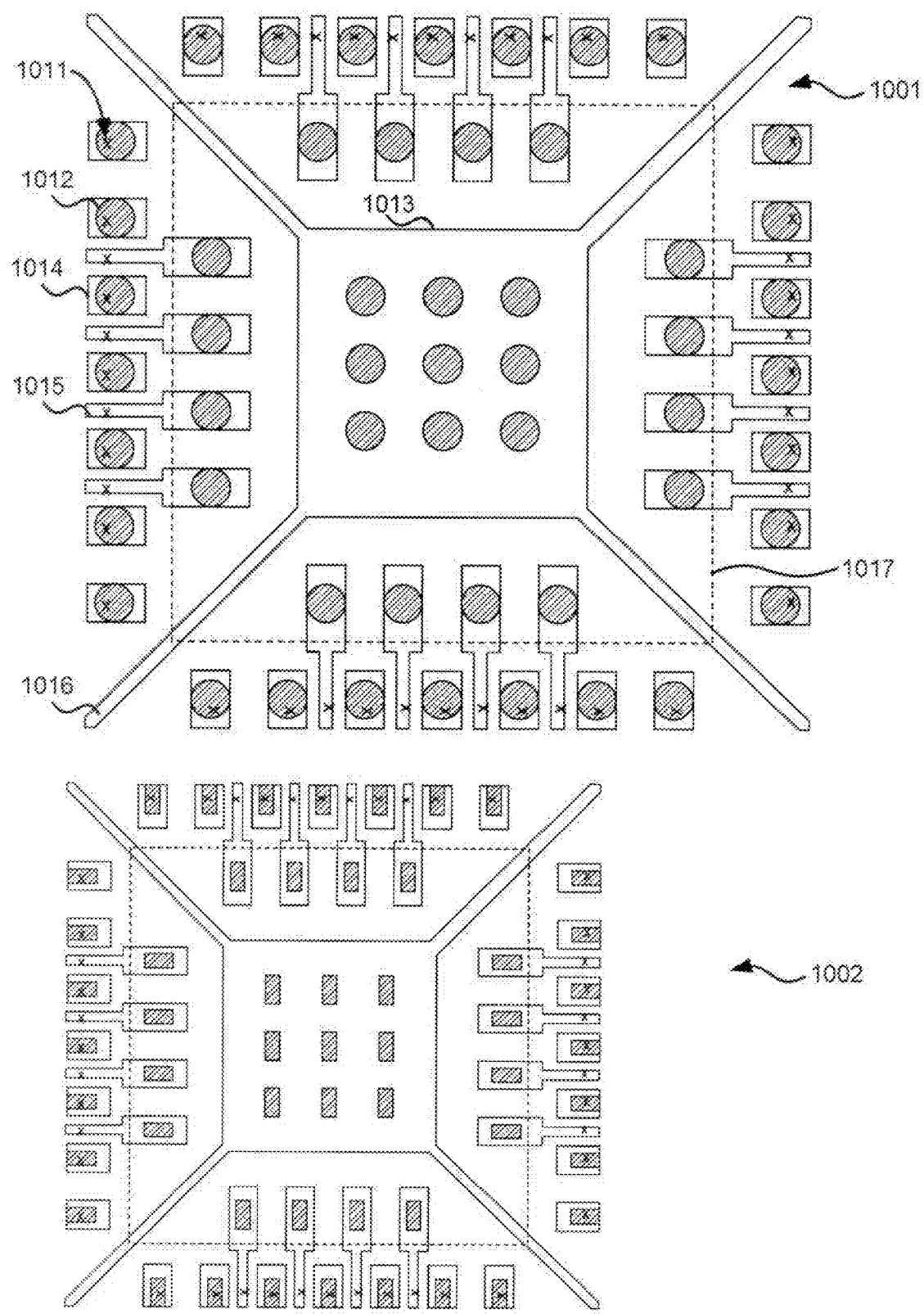
Figure 11:
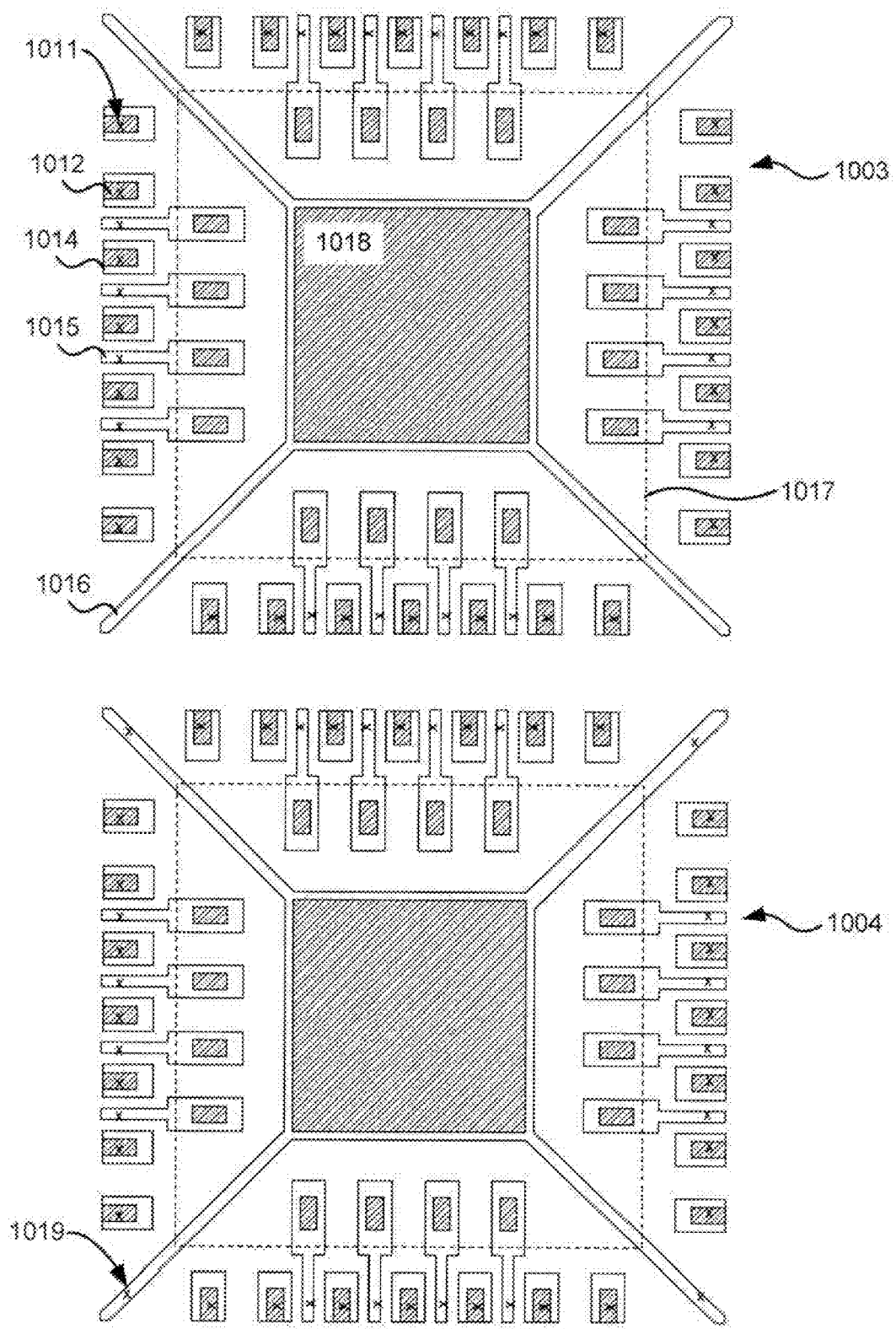
Figure 12:
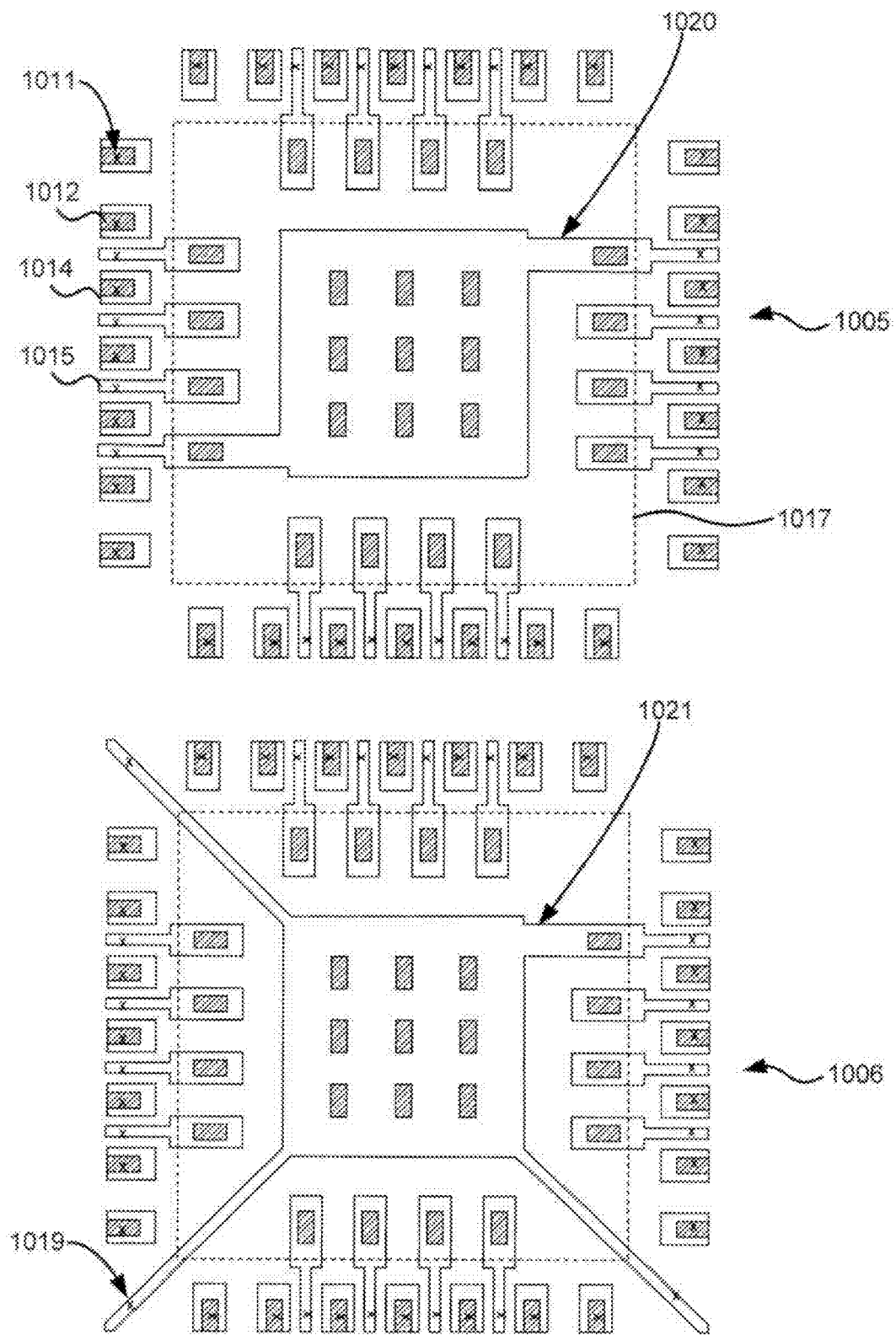

FIGS. 10-12 show further examples 1001-1006 of package design which may be considered variants of the examples shown in FIGS. 5 and 9 and described above. The first example 1001 shows a number of leads 1014-1015 some of which (1015) fan underneath the die (as indicated by the dotted line 1017 showing the die outline). The positions of the wirebonds on the leads are marked with an 'X' 1011 and the positions of the apertures in the moulding compound which form the solder lands are shown as shaded regions 1012 (circles in the first example 1001). The paddle 1013 is also shown and in this example, the paddle includes tie bars 1016, which connect the paddle to the ring of the leadframe before encapsulation and dicing. In this first example, some of the lands 1012 are underneath the paddle and all the lands are the same shape and size. The second example 1002 shown in FIG. 10 has rectangular lands rather than circular lands. It will be appreciated that other shapes may alternatively be used (e.g. square or oval lands).

The two examples 1003-1004 in FIG. 11 show an exposed paddle (as indicated by the large shaded area 1018). In the second of these two examples 1004, there are wirebonds 1019 to the tie bars 1016. The first example 1005 in FIG. 12 shows a leadframe 1020 which comprises combined tie bars and leads. The second example 1006 shows a leadframe 1021 with both combined tie bars and leads and separate tie bars and also shows wirebonds 1019 to the tie bars.

It will be appreciated that whilst in the examples described above, the apertures (and solder lands) are formed by internal projections within the mould chase, the apertures may alternatively be formed by an insert which is placed inside a standard (planar) mould chase to form the required internal projections which make contact with the leadframe during the encapsulation process. Although the examples show apertures only being created on a single side of the package (i.e. on the bottom in the examples shown) to expose regions of the leadframe, in other examples, apertures may be created on any one or more sides of the package.

The improved packages and improved process flow described above may enable one or more of the following:
- an improved wire-bonding yield of QFN (and in particular CoL QFN) packages, e.g. because wirebonding onto a half-etched leadframe can be avoided whilst still enabling multiple rows of solder lands which form electrical connections between the substrate and I/Os on the die;
- an improved track/gap capability of CoL leadframes, e.g. because of the ability to fan leads underneath the die and to choose the positions of the solder lands (rather than have all of the underneath of the leadframe exposed, as shown in FIG. 1) and/or because of the ability to use thinner leadframes (as leadframes need not be etched to enable multiple rows of connections);
- an improved surface-mount yield of QFN packages, e.g. because the solder lands can be designed to be the same shape and size and/or because solder balls may be used instead of solder paste, which overcomes problems associated with open/short circuit pins because of variable collapse during solder reflow resulting from use of different solder volumes/areas;

improved board-level reliability of QFNs, e.g. because use of solder balls adds to the volume of solder in the joints, increases the stand-off height of the package above the substrate, and provides greater ability to overcome warpage, and thermal expansion, of the package and the substrate (e.g. the PCB).

simplified PCB rework, e.g. because solder balls can be applied to the QFN package which negates the need to define solder paste on the part-populated PCB being reworked.

An improved QFN package, such as described above, with solder balls may be used as a replacement to an existing BGA package. Through design of the leadframe and the position of the apertures, the pin-out of the improved QVN can be designed to be the same as an existing BGA package. This may provide a lower cost alternative and also may provide better thermal performance than a similar size BGA because the leadframes are typically made of copper which is more thermally conductive than PCB. Additionally, leadframe manufacture may be considered more environmentally friendly than BGA substrate manufacture. BGA substrates use the same processes as PCBs—which are considered polluting.

The technology described herein could also provide a way for attaching discrete components within the package, without the need for half etching. These discrete components, which may for example be soldered decoupling capacitors (e.g. of size 0402), may then be encapsulated within the moulding compound. An example of this is shown in FIG. 13.

Figure 13:
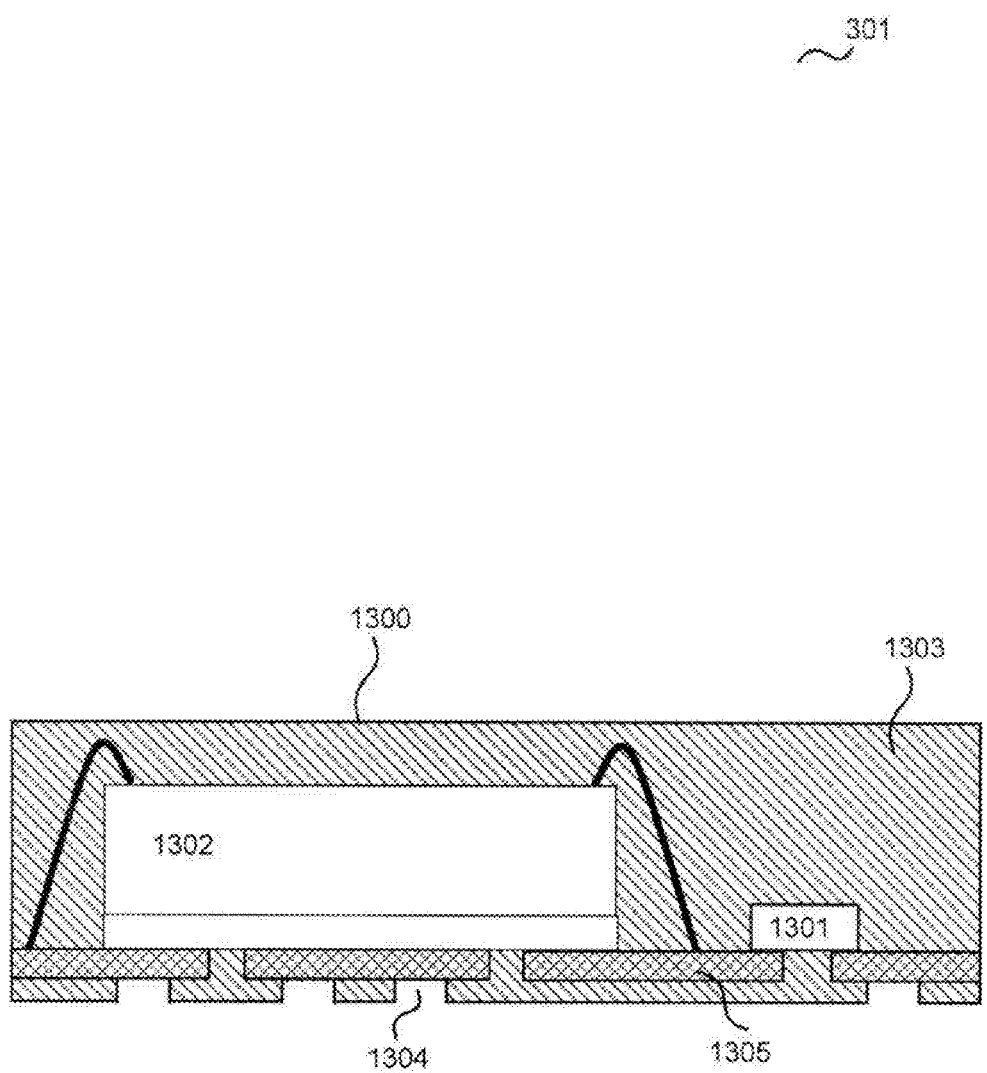
FIG. 13 shows a schematic diagram of an improved QFN package which includes an embedded discrete component in addition to a silicon die.

FIG. 13 shows a schematic diagram of an improved QFN package 1300 in which a discrete component 1301 (e.g. a capacitor or resistor) and a die 1302 are encapsulated in moulding compound 1303. Projections in the mould chase (as described above) are used to create apertures 1304 in the moulding compound which expose areas of the leadframe 1305 to create lands for connecting to the package (e.g. physically, thermally and/or electrically).

In the examples shown above, the thickness of the leadframe used is substantially constant (e.g. a constant thickness of 150μ to within manufacturing tolerances). These examples (and methods) are described as negating the need to part-etch or part-saw the leadframes in order to produce multiple rows of solder lands, in further examples, the techniques described above may be used in combination with methods which involve part-etching or part-sawing of leadframes.

Although the methods and examples described herein relate to QFN packages, the principles may also be applied to other types of packages. Examples include Dual-Flat No-lead (DFN), Quad Flat Pack (QFP), and Small Outline (SO) packages. In an example, the techniques may be applied to versions of these packages (e.g. DFN, QFP, SO) with an exposed paddle and the techniques may be used to reduce the paddle area and to stop the package floating during solder reflow (e.g. as described above). The techniques may also be applied to other package designs, such as the FusionQuad produced by Amkor. The techniques described above may also be used to embed a substrate (PCB) in a package, rather than a leadframe, to form a BGA.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term comprising is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A packaged die comprising a leadframe and a die attached to the leadframe, wherein the die and the leadframe are encapsulated in a moulding compound, the packaged die further comprises a plurality of apertures formed in the moulding compound each of which expose a portion of the leadframe, and the leadframe has a substantially constant thickness.

2. A packaged die according to claim 1, wherein each aperture is formed by an internal projection in a mould chase used when encapsulating the die and the leadframe.

3. A packaged die according to claim 1, wherein each aperture forms an area for connection of the packaged die to a substrate.

4. A packaged die according to claim 3, wherein each aperture forms an area for at least one of a physical connection, an electrical connection and a thermal connection.

5. A packaged die according to claim 1, wherein each of the plurality of apertures has the same area.

6. A packaged die according to claim 1, wherein the plurality of apertures are formed on an underside of the packaged die and are arranged in at least two rows of apertures around a portion of the periphery of the underside.

7. A packaged die according to claim 1, wherein the leadframe comprises a lead that fans underneath the die and wherein one of the plurality of apertures exposes a portion of the lead underneath the die.

8. A packaged die according to claim 1, further comprising a plurality of solder elements, wherein each solder element is attached to an exposed portion of the leadframe.

9. A packaged die according to claim 1 which comprises a Quad Flat No. Lead package.

10. A packaged die according to claim 9, which comprises a Chip-on-Lead Quad Flat No-Lead package.

11. A method of fabricating a packaged die comprising:
attaching a die to a leadframe, wherein the leadframe has a substantially constant thickness;
wirebonding the die to the leadframe; and
encapsulating the die and the leadframe using a mould compound and a mould chase comprising a plurality of projections, wherein each projection forms an aperture in the mould compound that exposes a portion of the leadframe.

12. A method according to claim 11, further comprising: separating the encapsulated die to form a plurality of packaged die.

13. A method according to claim 11, further comprising: attaching a solder element to each exposed portion of the leadframe.

14. A method according to any of claim 11, wherein each of the plurality of apertures has the same area.

15. A method according to claim 11, wherein the packaged die comprises a Quad Flat No-Lead package.

16. A method according to claim 11, wherein the packaged die comprises a Chip-on-Lead Quad Flat No-Lead package.

* * * * *

UNITED STATES PATENT AND TRADEMARK OFFICE
CERTIFICATE OF CORRECTION

PATENT NO. : 8,110,903 B2
APPLICATION NO. : 12/544468
DATED : February 7, 2012
INVENTOR(S) : Peter John Robinson It is certified that error appears in the above-identified patent and that said Letters Patent is hereby corrected as shown below:

In Fig. 13, Sheet 13 of 13, delete " 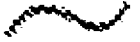 ".

In Column 4, Line 58, delete "doffed" and insert -- dotted --, therefor.

In Column 5, Line 31, delete "Technologies." and insert -- Technologies --, therefor.

In Column 7, Line 11, delete "PCB)." and insert -- PCB); --, therefor.

In Column 7, Line 20, delete "QVN" and insert -- QFN --, therefor.

In Column 8, Line 7, delete "comprising" and insert -- 'comprising' --, therefor.

In Column 8, Line 21, delete "art" and insert -- art. --, therefor.

In Column 8, Line 59, in Claim 9, delete "No. Lead" and insert -- No-Lead --, therefor.

In Column 10, Line 1, in Claim 14, delete "any of claim 11," and insert -- claim 11, --, therefor.

Signed and Sealed this
Twenty-sixth Day of June, 2012

David J. Kappos
*Director of the United States Patent and Trademark Office*